United States Patent [19]
Hively

[11] Patent Number: 5,869,869
[45] Date of Patent: Feb. 9, 1999

[54] MICROELECTRONIC DEVICE WITH THIN FILM ELECTROSTATIC DISCHARGE PROTECTION STRUCTURE

[75] Inventor: James W. Hively, Sunnyvale, Calif.

[73] Assignee: LSI Logic Corporation, Milpitas, Calif.

[21] Appl. No.: 595,021

[22] Filed: Jan. 31, 1996

[51] Int. Cl.$^6$ .............................. H01L 21/58; H01L 21/60
[52] U.S. Cl. ........................... 257/355; 257/530; 257/780
[58] Field of Search .................................. 257/173, 356, 257/779, 780, 355, 357, 358, 359, 360, 361, 362, 363, 530, 738

[56] References Cited

U.S. PATENT DOCUMENTS

| | | | |
|---|---|---|---|
| 4,705,205 | 11/1987 | Allen et al. | 228/180.2 |
| 4,825,280 | 4/1989 | Chen et al. | 357/71 |
| 4,959,708 | 9/1990 | Henderson et al. | 257/355 |
| 4,977,357 | 12/1990 | Shrier | 338/212 |
| 5,059,553 | 10/1991 | Berndlmaier et al. | 257/780 |
| 5,132,774 | 7/1992 | Matsuura et al. | 257/758 |
| 5,262,754 | 11/1993 | Collins | 338/21 |
| 5,329,423 | 7/1994 | Scholz | 257/738 |
| 5,334,857 | 8/1994 | Mennitt et al. | 257/48 |
| 5,414,284 | 5/1995 | Baxter et al. | 257/355 |
| 5,493,142 | 2/1996 | Randazzo et al. | 257/328 |
| 5,500,605 | 3/1996 | Chang | 324/758 |
| 5,514,892 | 5/1996 | Countryman et al. | 257/355 |
| 5,600,180 | 2/1997 | Kusaka et al. | 257/778 |
| 5,631,499 | 5/1997 | Hosomi et al. | 257/738 |

FOREIGN PATENT DOCUMENTS

| | | | |
|---|---|---|---|
| 0 075 892 A2 | 4/1983 | European Pat. Off. | 257/355 |
| 0 202 109 A2 | 11/1986 | European Pat. Off. | 257/355 |
| 1562742 | 5/1968 | France | 257/355 |
| 27 13 936 A1 | 10/1978 | Germany | 257/355 |
| PCT/US95/ 08683 | 7/1995 | WIPO . | |
| PCT/US95/ 08808 | 7/1995 | WIPO . | |

*Primary Examiner*—Donald L. Monin, Jr.

[57] ABSTRACT

Microelectronic devices are formed on a substrate of an integrated circuit. An electrically conductive ground or power plane, and an ElectroStatic Discharge (ESD) protection layer are formed on the substrate. Terminals such as solder ball or wire bond pads are formed on the substrate, and are electrically connected to the devices. The protection layer is patterned such that portions thereof are disposed between the terminals and the plane to define vertical electrical discharge paths. The protection layer is formed of a material such as SurgX™ which is normally dielectric, and is rendered conductive in the discharge paths by an electrostatic potential applied to the terminals during an ESD event to shunt the electrostatic potential from the terminals to the plane. Alternatively, the protection layer can be formed between the terminals to define lateral discharge paths.

17 Claims, 4 Drawing Sheets

MICROELECTRONIC DEVICE WITH THIN FILM ELECTROSTATIC DISCHARGE PROTECTION STRUCTURE

BACKGROUND OF THE INVENTION

1. Field of the Invention

The present invention generally relates to the art of microelectronic devices, and more specifically to a microelectronic integrated circuit with a thin film electrostatic discharge protection structure.

2. Description of the Related Art

In Metal Oxide Semiconductor (MOS) integrated circuits, input signals are applied to terminals which are connected to gates of MOS Field-Effect Transistors (FETs). If the voltage applied to the gate insulator becomes excessive, the gate oxide can break down.

The dielectric breakdown strength of $SiO_2$ is approximately $8 \times 10^6$ V/cm. Thus, a 15-nm gate oxide will not tolerate voltages greater than 12 V without breaking down. Although this is well in excess of the normal operating voltages of 5 V integrated circuits, voltages higher than this may be impressed upon the inputs to the circuits during either human-operator or mechanical handling operations.

The main source of such voltages is triboelectricity (electricity caused when two materials are rubbed together). A person can develop a very high static voltage (i.e., a few hundred to a few thousand volts) simply by walking across a room or by removing an integrated circuit from its plastic package, even when careful handling procedures are followed. If such a high voltage is accidentally applied to the pins of an integrated circuit package, its discharge (referred to as electrostatic discharge, or EDS) can cause breakdown of the gate oxide of the devices to which it is applied.

The breakdown event may cause sufficient damage to produce immediate destruction of the device, or it may weaken the oxide enough that it will fail early in the operating life of the device (and thereby cause device failure).

All pins of MOS integrated circuits must be provided with protective circuits to prevent such voltages from damaging the MOS gates. The need for such circuits is also mandated by the increasing use of VLSI devices in such high-noise environments as personal computers, automobiles, and manufacturing control systems.

These protective circuits, normally placed between the input and output pads on a chip and the transistor gates to which the pads are connected, are designed to begin conducting or to undergo breakdown, thereby providing an electrical path to ground (or to the power-supply rail). Since the breakdown mechanism is designed to be nondestructive, the circuits provide a normally open path that closes only when a high voltage appears at the input or output terminals, harmlessly discharging the node to which it is connected.

The prior art includes four main types of circuits for provide protection against ESD damages, more specifically:

1. diode breakdown
2. node-to-node punchthrough
3. gate-field-induced breakdown
4. Parasitic pnpn diode (thyristor) latchup.

These circuits are well known, and will not be discussed in detail herein. Often, a combination of protection methods is used, for example a breakdown diode and one of the other protection devices connected in parallel with the gate being protected.

The prior art ESD protection circuits require that the integrated circuits be provided with additional elements such as diodes and thyristors for each terminal. This reduces the area on the circuits for devices which provide primary logical functionality, and increases the complexity and cost of the integrated circuits.

SUMMARY OF THE INVENTION

In accordance with the present invention, microelectronic devices are formed on a substrate of an integrated circuit. An electrically conductive ground or power plane, and an Electrostatic Discharge (ESD) protection layer are formed on the substrate. Terminals such as solder ball or wire bond pads are formed on the substrate, and are electrically connected to the devices.

The protection layer is patterned such that portions thereof are disposed between the terminals and the plane to define vertical electrical discharge paths. The protection layer is formed of a material such as SurgX™ which is normally dielectric, and is rendered conductive in the discharge paths by an electrostatic potential applied to the terminals during an ESD event to shunt the electrostatic potential from the terminals to the plane.

Alternatively, the protection layer can be formed between the terminals to define lateral electrical discharge paths.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
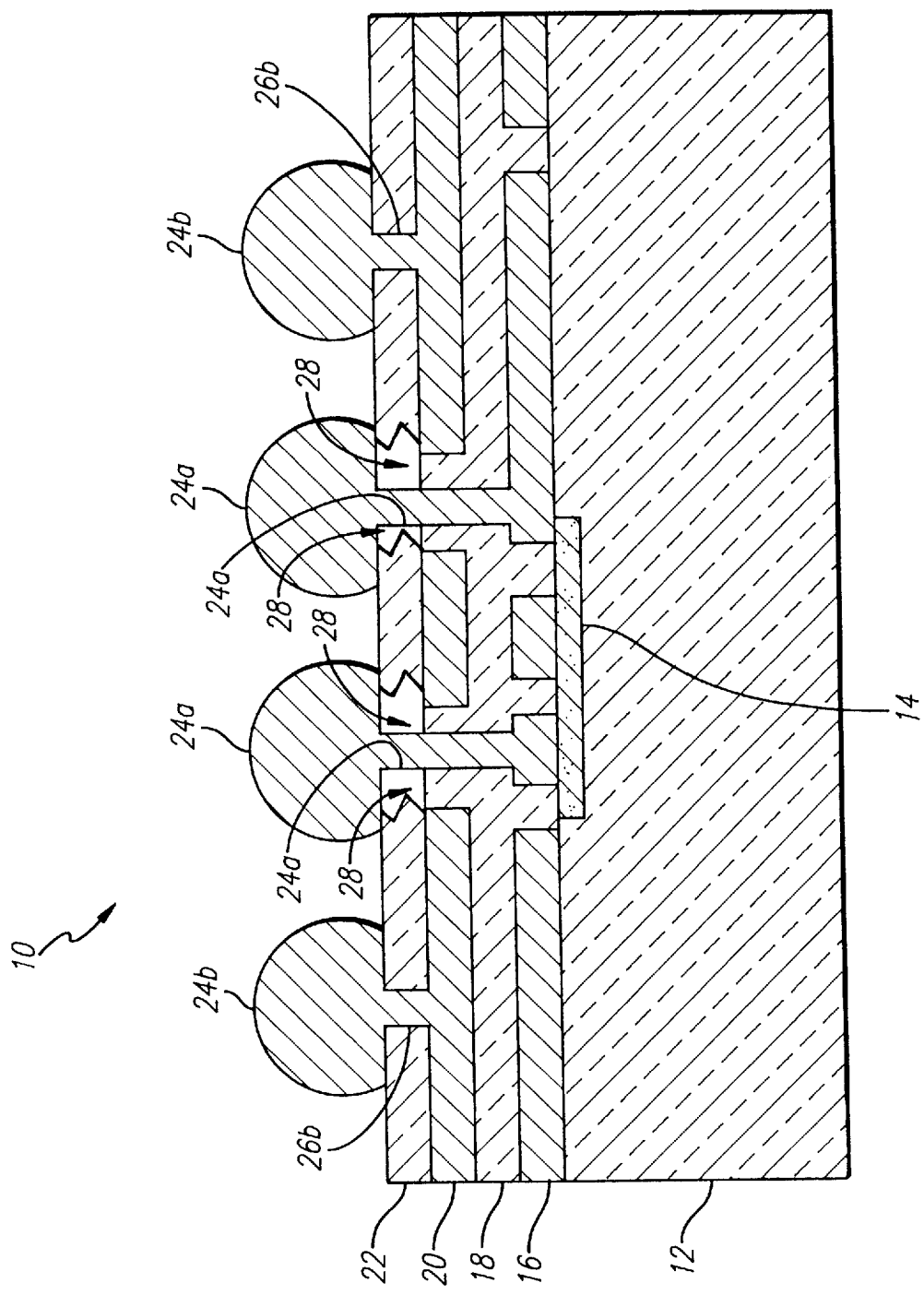
FIG. 1 is a simplified sectional view illustrating a flip-chip integrated circuit according to the present invention.

FIG. 1 illustrates a first embodiment of an integrated circuit 10 including a thin film electrostatic discharge protection structure according to the present invention. The circuit 10 is illustrated as having a flip-chip configuration, although the invention is not so limited.

The circuit 10 comprises a semiconductor substrate 12 with a large number of microelectronic devices such as MOS FETs formed thereon. Only one device is symbolically shown for simplicity of illustration, and designated by the reference numeral 14.

An electrically conductive metal signal layer 16 is formed on the substrate, and patterned to provide the required logical functionality. The signal layer 16 is appropriately connected to the devices, e.g. at 14.

A dielectric layer 18 of silicon dioxide or the like is formed on the signal layer 16, and is also suitable patterned. A metal plane layer 20, which may be a power or ground plane, is formed on the dielectric layer 18.

In accordance with the present invention, an ElectroStatic Discharge (ESD) protection layer 22 is formed on the plane layer 20. The protection layer 22 is a thin film of a polymer or other suitable material which is normally dielectric, and is rendered conductive by a high applied electrostatic potential such as occurs during an ESD event.

Although the scope of the present invention is not limited to any particular material, a preferred material for the protection layer 22 is SurgX™, which is commercially available from the Oryx Technology Corporation of Fremont, Calif. In the illustrated example, the thickness of the protection layer 22 is on the order of 2 micrometers.

External connection to the device 14 is provided by an array of terminals in the form of solder balls 24a and 24b. The balls 24a and 24b are identical, and are designated by different reference numerals only because the balls 24a are connected to the signal layer 20 by electrically conductive vias 26a, and the balls 24b are connected to the plane layer 20 by vias 26b. It will be understood for the purpose of the present invention that the term "solder balls" is generic to elongated solder columns in addition to round balls as illustrated, as well as other similar configurations.

Vertical electrical discharge paths 28 having a length of 2 micrometers are defined in the protection layer 22 between lateral portions of the solder balls 24a and the underlying portions of the plane layer 20. The layer 22 is normally dielectric, and does not affect the functional operation of the integrated circuit 10. However, in response to an applied high electrostatic potential during an ESD event, the layer 22 becomes temporarily conductive, and shunts the ESD potential from a solder ball 24a to which the potential is applied away from the device 14 to the plane layer 20 through the respective discharge path 28.

In accordance with the present invention, the ESD potential is not applied to the device 14, and therefore the device 14 is not damaged. The material of the protective layer 22 is selected such that the resistance thereof increases back to its initial level, and the layer 22 again becomes dielectric, after the ESD potential is removed. An ESD potential applied to the one of the solder balls 24b does not pass through the protection layer 22, but instead is conducted directly to the plane layer 20 through the respective via 26b.

Figure 2:
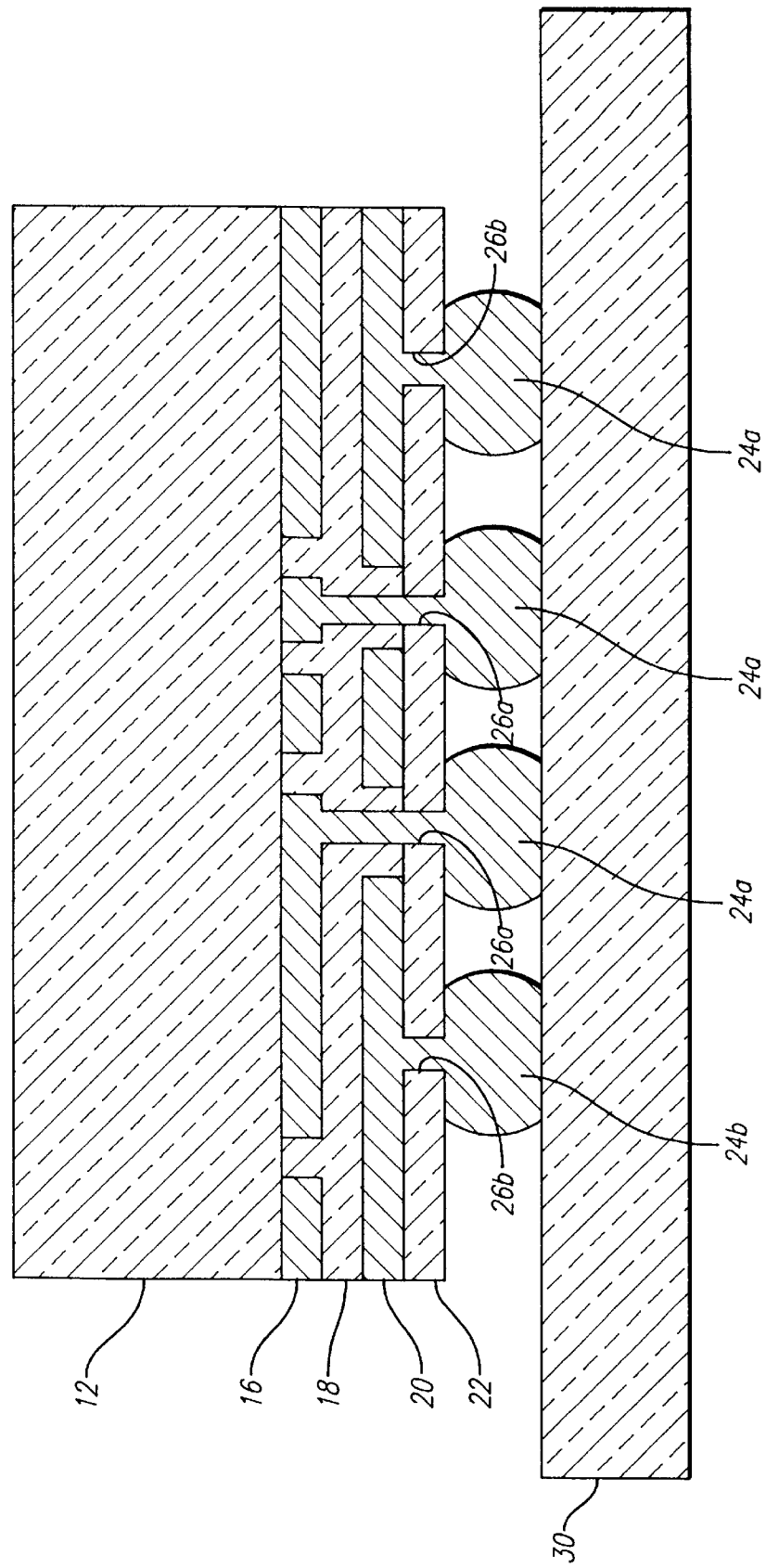
FIG. 2 is a simplified sectional view illustrating a flip-chip integrated circuit of FIG. 1 mounted on a circuit board.

FIG. 2 is similar to FIG. 1, and further illustrates the integrated circuit 10 as being operatively mounted on a printed circuit board 30 via the solder balls 24a and 24b in a flip-chip arrangement.

Figure 3:
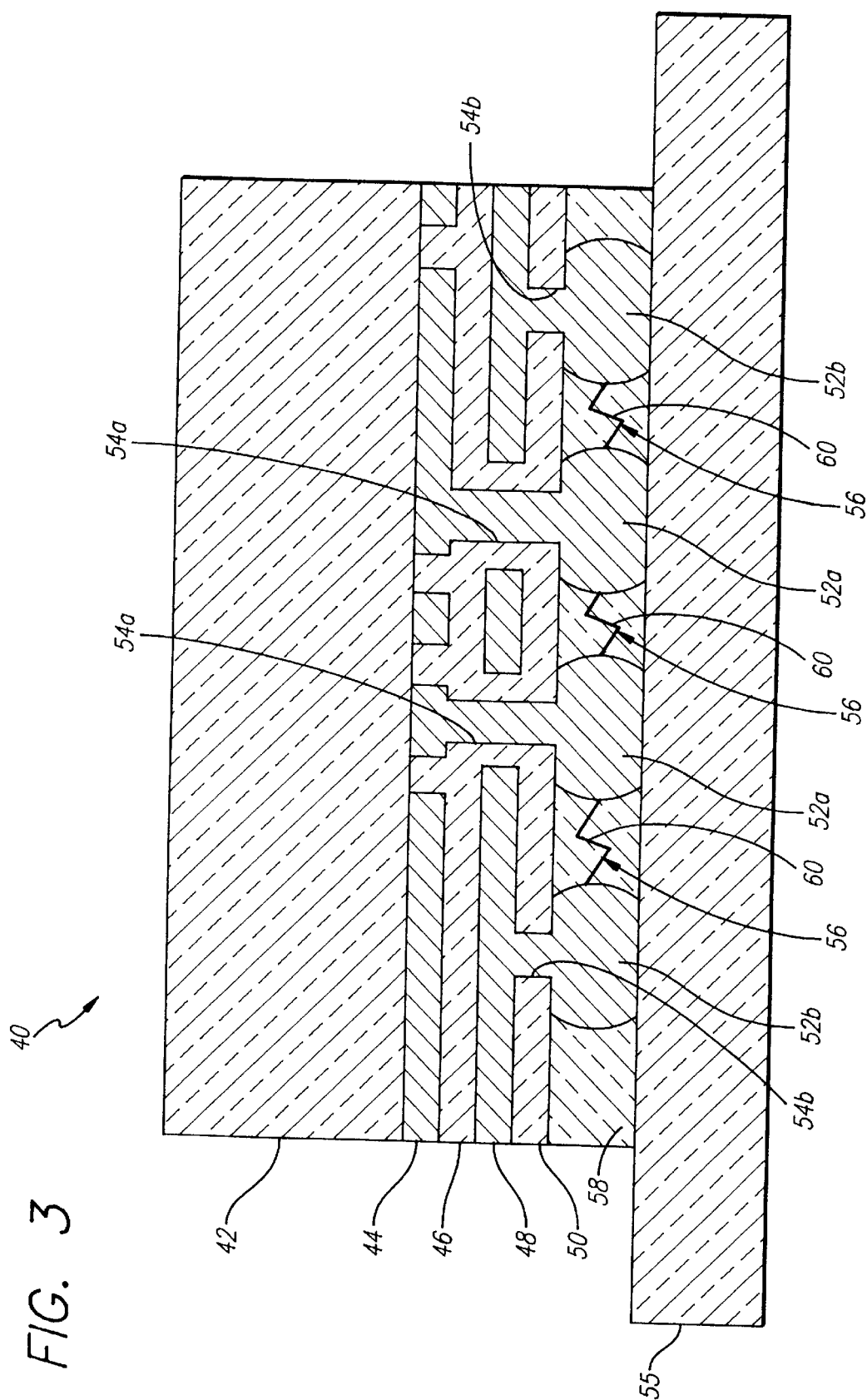
FIG. 3 is a simplified sectional view illustrating another flip-chip integrated circuit mounted on a circuit board.

FIG. 3 illustrates another integrated circuit 40 according to the present invention, in which the electrical discharge paths in the protection layer are lateral rather than vertical. The circuit 40 comprises a semiconductor substrate 42 having microelectronic devices (not shown) formed thereon.

An electrically conductive metal signal layer 44 is formed on the substrate 42, is patterned to provide the required logical functionality, and is appropriately connected to the devices as described above.

A dielectric layer 46 of silicon dioxide or the like is formed on the signal layer 44, and metal plane layer 48, which may be a power or ground plane, is formed on the dielectric layer 46. Another dielectric layer 50 is formed on the plane layer 48.

External connection to the devices is provided by an array of terminals in the form of solder balls 52a and 52b. The balls 52a are connected to the signal layer 44 by vias 54a, and the balls 52b are connected to the plane layer 48 by vias 54b. The integrated circuit 40 is mounted on a chip package substrate or printed circuit board 55 via the solder balls 52a and 52b.

In the integrated circuit 40, the lateral spaces between the solder balls 52a and 52b are filled with an electrostatic discharge protection layer 58 formed of a material such as SurgX™ as described above. These spaces constitute lateral electrical discharge paths 56 through which an applied ESD potential is shunted from the balls 52a to the plane layer 48 as indicated at 60.

More specifically, an ESD potential applied to a solder ball 52a causes the material of the protective layer 58 to become conductive as at 60, and provide an electrical path between the solder ball 52a to an adjacent solder ball 52a or 52b.

If a directly adjacent solder ball is 52b, and is thereby connected to the plane layer 48, this connection causes the ESD potential to be shunted from the solder ball 52a, through the respective discharge path 56, solder ball 52b and via 54b to the plane layer 48. Thus, the ESD potential is prevented from reaching the devices on the substrate 42. If no solder ball 52b is directly adjacent to a solder ball 52a to which an ESD potential is applied, the potential will be shunted through electrical discharge paths 56 and one or more solder balls 52a to the one of the solder balls 52b and thereby to the plane layer 48.

Although the present invention is not limited to any specific dimensions, the solder balls 52a and 54b preferably have a diameter of 4 mils (0.01 millimeter), and are spaced from each other at a pitch of 8 mils (0.02 millimeter). Thus, the lateral discharge paths 56 have a length of 4 mils (0.01 millimeter).

Figure 4:
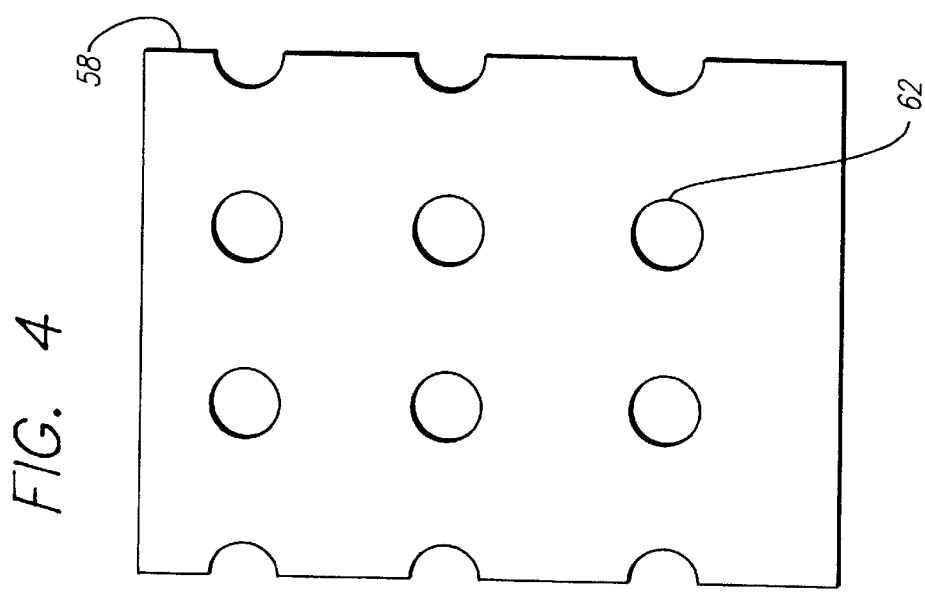
FIG. 4 is a plan view illustrating a patterned ElectroStatic Discharge (ESD) protection layer according to the present invention.

FIG. 4 is a plan view illustrating the pattern configuration of the protection layer 58 for a flip-chip solder ball grid array as described above. The layer 58 is formed with openings 62 for the solder balls 52a and 52b.

Figure 5:
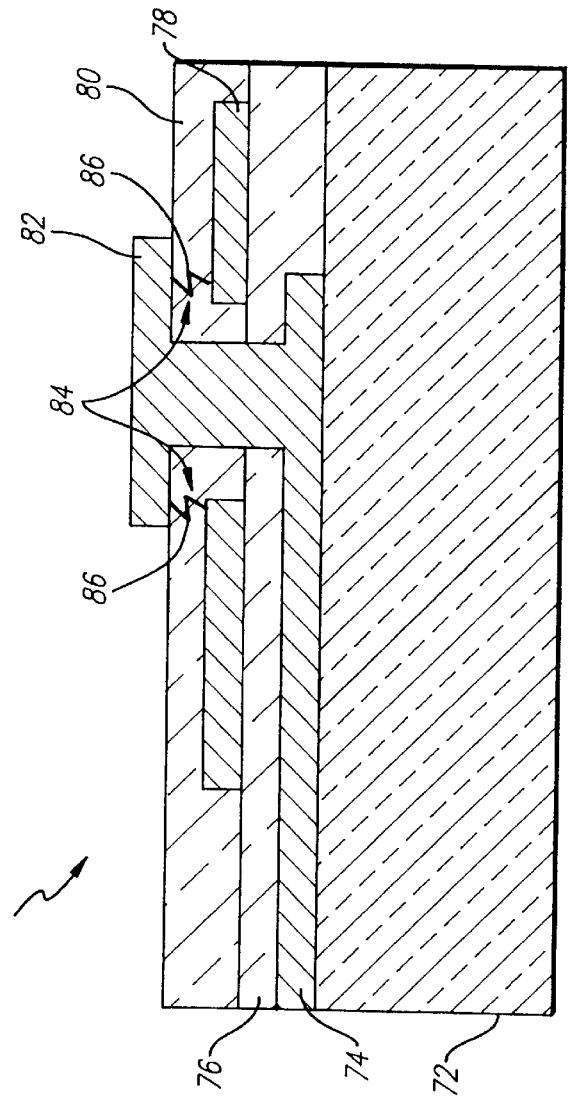
FIG. 5 is a simplified sectional view illustrating a wire bond connection integrated circuit according to the present invention.

FIG. 5 illustrates another integrated circuit 70 embodying the present invention, including a substrate 72, signal layer 74, dielectric layer 76, power or ground plane layer 78, and ESD protection layer 80 substantially as described above. The circuit 70 differs from the other embodiments of the invention in that the terminals, rather than being solder balls, are wire bond pads 82 having lateral portions which overlie electrical discharge paths 84 in the protection layer 80. In response to an ESD event, the discharge paths 84 become conductive as indicated at 86 to shunt the ESD potential from the wire bond pad 82 to the plane layer 78.

The integrated circuits described above are fabricated by the steps of forming the devices in the substrate, forming and patterning the metal, dielectric and protection layers on the substrate, and forming the terminals over the protection layers in the illustrated configurations.

Various modifications will become possible for those skilled in the art after receiving the teachings of the present disclosure without departing from the scope thereof.

I claim:

1. An integrated circuit, comprising:
   a substrate having a microelectronic device formed thereon;
   an electrically conductive member formed on the substrate;
   an ElectroStatic Discharge (ESD) protection layer formed on the substrate; and
   a terminal which is formed on the substrate and is electrically connected to the device, in which:
   the protection layer is patterned such that a portion thereof is disposed between the terminal and the conductive member to define an electrical discharge path;

the protection layer is formed of a material which is normally dielectric, and is rendered temporarily conductive in the discharge path by an electrostatic potential applied to the terminal during an ESD event to shunt the electrostatic potential from the terminal to the conductive member;

the conductive member underlies the discharge path; and the terminal comprises a solder ball having a lateral portion which overlies the discharge path.

2. An integrated circuit as in claim 1 wherein the discharge path is substantially vertical and is directly beneath the lateral portion of the solder ball.

3. An integrated circuit, comprising:

a substrate having a microelectronic device formed thereon;

an electrically conductive member formed on the substrate;

an ElectroStatic Discharge (ESD) protection layer formed on the substrate; and a terminal which is formed on the substrate and is electrically connected to the device, in which:

the protection layer is patterned such that a portion thereof is disposed between the terminal and the conductive member to define an electrical discharge path;

the protection layer is formed of a material which is normally dielectric, and is rendered temporarily conductive in the discharge path by an electrostatic potential applied to the terminal during an ESD event to shunt the electrostatic potential from the terminal to the conductive member;

the conductive member underlies the discharge path; and the terminal comprises a wire bond pad which overlies the discharge path.

4. An integrated circuit as in claim 3 wherein the discharge path is substantially vertical and is directly beneath the wire bond pad.

5. An integrated circuit as in claim 3 wherein the conductive member comprises a power or ground plane layer.

6. An integrated circuit, comprising:

a substrate having a microelectronic device formed thereon;

an electrically conductive member formed on the substrate;

an ElectroStatic Discharge (ESD) protection layer formed on the substrate; and a terminal which is formed on the substrate and is electrically connected to the device, in which:

the protection layer is patterned such that a portion thereof is disposed between the terminal and the conductive member to define an electrical discharge path;

the protection layer is formed of a material which is normally dielectric, and is rendered temporarily conductive in the discharge path by an electrostatic potential applied to the terminal during an ESD event to shunt the electrostatic potential from the terminal to the conductive member;

the conductive member comprises another terminal which is laterally spaced from said terminal;

the discharge path is substantially lateral.

7. An integrated circuit as in claim 6 wherein at least a portion of the discharge path is from the terminal to said another terminal.

8. An integrated circuit, comprising:

a substrate having a microelectronic device thereon;

an electrically conductive member on the substrate;

an ElectroStatic Discharge (ESD) protection layer on the substrate;

a terminal supported by the substrate and electrically connected to the device;

a portion of the protection layer is disposed between the terminal and the conductive member to define an electrical discharge path;

the protection layer is formed of a material which is normally dielectric, and is rendered temporarily conductive in the discharge path by an electrostatic potential applied to the terminal during an ESD event to shunt the electrostatic potential from the terminal to the conductive member; and the discharge path is substantially parallel to the substrate.

9. An integrated circuit as in claim 8 wherein the terminal is mounted on a circuit board in a flip-chip arrangement.

10. An integrated circuit, comprising:

a substrate having a microelectronic device thereon;

an electrically conductive member on the substrate;

an ElectroStatic Discharge (ESD) protection layer on the substrate;

a first terminal supported by the substrate and electrically connected to the device;

a portion of the protection layer is disposed between the first terminal and the conductive member to define an electrical discharge path;

the protection layer is formed of a material which is normally dielectric, and is rendered temporarily conductive in the discharge path by an electrostatic potential applied to the terminal during an ESD event to shunt the electrostatic potential from the first terminal to the conductive member;

a second terminal supported by the substrate; and the protection layer is formed between the first and second terminals.

11. An integrated circuit, comprising:

a substrate having a microelectronic device thereon;

an electrically conductive member on the substrate;

an ElectroStatic Discharge (ESD) protection layer on the substrate;

a first terminal supported by the substrate and electrically connected to the device;

a portion of the protection layer is disposed between the first terminal and the conductive member to define an electrical discharge path;

the protection layer is formed of a material which is normally dielectric, and is rendered temporarily conductive in the discharge path by an electrostatic potential applied to the terminal during an ESD event to shunt the electrostatic potential from the first terminal to the conductive member;

the conductive member includes a second terminal; and the protection layer is formed sandwiched directly between the first and second terminals.

12. An integrated circuit as in claim 11 wherein the first and second terminals comprise first and second solder balls, respectively.

13. An integrated circuit, comprising:

a substrate having a microelectronic device thereon;

an electrically conductive member on the substrate;

an ElectroStatic Discharge (ESD) protection layer on the substrate;

a terminal supported by the substrate and electrically connected to the device;

a portion of the protection layer is disposed between the terminal and the conductive member to define an electrical discharge path;

the protection layer is formed of a material which is normally dielectric, and is rendered temporarily conductive in the discharge path by an electrostatic potential applied to the terminal during an ESD event to shunt the electrostatic potential from the terminal to the conductive member;

the terminal comprises a first solder ball;

a second solder ball supported by the substrate; and the protection layer includes a first opening for the first solder ball and a second opening for the second solder ball.

14. An integrated circuit, comprising:

a substrate having a microelectronic device thereon;

an electrically-conductive signal layer on the substrate;

a dielectric layer on the signal layer;

a metal plane layer on the dielectric layer;

an ElectroStatic Discharge (ESD) protection layer on the plane layer;

a terminal electrically connected to the device;

a portion of the protection layer is disposed between the terminal and the plane layer to define an electrical discharge path; and the protection layer is formed of a material which is normally dielectric, and is rendered temporarily conductive in the discharge path by an electrostatic potential applied to the terminal during an ESD event to shunt the electrostatic potential from the terminal to the plane layer.

15. An integrated circuit as in claim 14 wherein the terminal defines a first terminal, and further comprising a second terminal connected to the signal layer by an electrically conductive via, and an electrostatic potential applied to the second terminal during an ESD event does not pass through the protection layer, but is conducted directly to the plane layer through the via.

16. An integrated circuit as in claim 15 wherein the first and second terminals comprise solder balls.

17. An integrated circuit as in claim 16 wherein the solder balls are mounted on a printed circuit board in a flip-chip arrangement.

* * * * *